US 6,658,066 B1

(12) United States Patent
Magoon et al.

(10) Patent No.: US 6,658,066 B1
(45) Date of Patent: Dec. 2, 2003

(54) METHOD AND APPARATUS FOR MULTIPLE PHASE SPLITTING FOR DUAL BAND IQ SUBHARMONIC MIXER

(75) Inventors: Rahul Magoon, Irvine, CA (US); Alyosha Molnar, Costa Mesa, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/506,302

(22) Filed: Feb. 17, 2000

(51) Int. Cl.$^7$ ............................................ H04L 27/36
(52) U.S. Cl. ...................... 375/298; 375/339; 375/327
(58) Field of Search ................................. 375/326, 327, 375/339, 373, 371, 375, 294; 327/3, 156, 147; 329/307, 345, 346, 302, 359, 360; 455/260, 147, 315; 331/19, 11, 46

(56) References Cited

U.S. PATENT DOCUMENTS

| | | | | |
|---|---|---|---|---|
| 5,357,284 A | * | 10/1994 | Todd | 348/486 |
| 5,574,671 A | * | 11/1996 | Young et al. | 708/204 |
| 5,867,542 A | * | 2/1999 | Iwamatsu et al. | 375/354 |
| 6,023,491 A | * | 2/2000 | Saka et al. | 375/326 |
| 6,310,925 B1 | * | 10/2001 | Kitta | 375/326 |
| 6,337,601 B1 | * | 1/2002 | Klemmer | 331/34 |

OTHER PUBLICATIONS

Buchwald, Aaron w., et al., *A 6–GHz Integrated Phase–Locked Loop Using AlGaAs/GaAs Heterojunction Bipolar Transistors*, SC–27 IEEE Journal of Solid–State Circuits 1752–1762 (Dec., 1992).

Fong, Keng Leong, *Design and Optimization Techniques for Monolithic RF Downconversion Mixers*, dissertation, Electrical Engineering and Computer Sciences, UNiversity of California, Berkeley (Fall, 1997).

Gray, P.R., et al. *Future Directions in Silicon ICs for RF Personal Communications*, Department of Electrical Engineering and Computer Sciences, University of California, Berkeley (no date).

Kim, Beomsup, et al., *PLL/DLL System Noise Analysis for Low Jitter Clock Synthesizer Design*, Department of Electrical Engineering and Computer Sciences, University of California, Berkeley (no date).

Lee, Thomas H., et al., *A 155–MHz Clock Recovery Delay– and Phase–Locked Loop*, SC–27 IEEE, Journal of Solid–State Circuits 1736–1746 (Dec., 1992).

Sabah, S., et al.,*Design and Calibration of IQ–Mixers*, http://www–tet.ee.tu–berlin.de/sabah/ABSTRACTS2.html (Nov. 5, 1999).

Stevenson, Jan–Michael, et al., *An Accurate Quality Factor Tuning Scheme for IF and High–Q Continuous–Time Filters*, 33–12 IEEE Journal of Solid–State Circuits 1970–1978 (Dec., 1998).

* cited by examiner

*Primary Examiner*—Emmanuel Bayard
(74) *Attorney, Agent, or Firm*—Mintz Levin Cohn Ferris Glovsky & Popeo, P.C.

(57) ABSTRACT

A method and apparatus are provided for generating first and second modulation signals from a local oscillator signal for quadrature subharmonic modulation of a quadrature amplitude modulated information signal. The method includes the steps of delaying the local oscillator signal in a plurality of incremental odd and even delay steps to form respective sets of odd and even modulator signals, said odd set of modulator signals together forming the first modulation signal and said even set forming the second modulation signal for quadrature subharmonic modulation of the quadrature amplitude modulated information signal and controlling a magnitude of the incremental delays based upon a predetermined phase offset between the local oscillator signal and a last delay step of the incremental delay steps.

27 Claims, 7 Drawing Sheets

METHOD AND APPARATUS FOR MULTIPLE PHASE SPLITTING FOR DUAL BAND IQ SUBHARMONIC MIXER

FIELD OF THE INVENTION

The field of the invention relates to communication systems and more particularly to local oscillators and mixers used for frequency-translating information signals.

BACKGROUND OF THE INVENTION

Methods of modulating a carrier with an information signal are generally known. Typically the modulation of the carrier with the information signal results in the frequency-shifting (translation) of the information signal between a base band and a spectral location of the carrier frequency. Frequency translation (up or down) may be accomplished by modulating one signal with another within a modulator (mixer).

Methods of modulating the carrier include amplitude modulation (AM), frequency modulation (FM), phase modulation (PM), quadrature phase shift keying (QPSK) and quadrature amplitude modulation (QAM). While AM, FM and PAM are well known and reliable, they also transfer data at a low bit rate. Quadrature modulated signals, such as QPSK and QAM, have the capability of encoding each sample with a number of information bits and are, therefore, more efficient. For example, QPSK encode information at a rate of two bits per sample. One particular type of QAM (i.e., 16-QAM) encodes data at a rate of 4 bits per sample (symbol) period.

In order to encode data at a rate of 4 bits per sample, 16-QAM relies on a constellation of 16 symbols. Of the 16 symbols, each symbol differs from the other symbols of its constellation by a predetermined amplitude and phase.

In order to encode QAM signals, a modulator modulates a carrier with a phase and amplitude required by a particular symbol. Typically quadrature components (I and Q) of a local oscillator (LO) are provided as a first input to a modulator. A bit set (4-bits for 16-QAM) is provided as a second input of the modulator for each symbol period. Each bit combination of the bit set corresponds to a particular symbol of the constellation. A controller of the modulator reads each bit set and modulates the quadrature components of the LO to generate the appropriate amplitude and phase required for any particular symbol.

Within a receiver, the process may be reversed. To decode a quadrature signal, quadrature components of a local oscillator may be mixed with a received signal, filtered and detected. An estimator may be used to estimate the received symbol based upon the detected quadrature components.

While encoding an information signal using quadrature amplitude modulation is effective, the advent of newer technologies such as direct conversion, has made the process more difficult. In the case of direct downconversion, a QAM information signal (centered on $f_{QAM}$) may be mixed with a LO signal (having a frequency $f_{LO}$), of substantially the same frequency. While translation of the information signal to baseband may be effective using such a process, the process may also generate interfering signals. For example, mixing the information signal $f_{QAM}$ with the LO signal $f_{LO}$ causes the LO signal to be reflected back into the antenna. The LO may be reflected back into the antenna because the bandpass filter which isolates the desired information signal $f_{QAM}$ also passes the LO signal $f_{LO}$. The reflection and interaction of the LO signal results in the generation of direct current (dc) interfering signals at baseband. The dc interference may result in a dc component within the decoded signal which is larger than the information signal, resulting in a significant decrease in a signal-to-noise S/N ratio. Because of the importance of QAM and direct conversion, a need exists for a direct conversion method which avoids generation of the dc signal components.

SUMMARY

A method and apparatus are provided for generating first and second modulation signals from a local oscillator signal for quadrature subharmonic modulation of a quadrature amplitude modulated information signal. The method includes the steps of delaying the local oscillator signal in a plurality of incremental odd and even delay steps to form respective sets of odd and even modulator signals, said odd set of modulator signals together forming the first modulation signal and said even set forming the second modulation signal for quadrature subharmonic modulation of the quadrature amplitude modulated information signal and controlling a magnitude of the incremental delays based upon a predetermined phase offset between the local oscillator signal and a last delay step of the incremental delay steps.

DETAILED DESCRIPTION OF A PREFERRED EMBODIMENT

Figure 1:
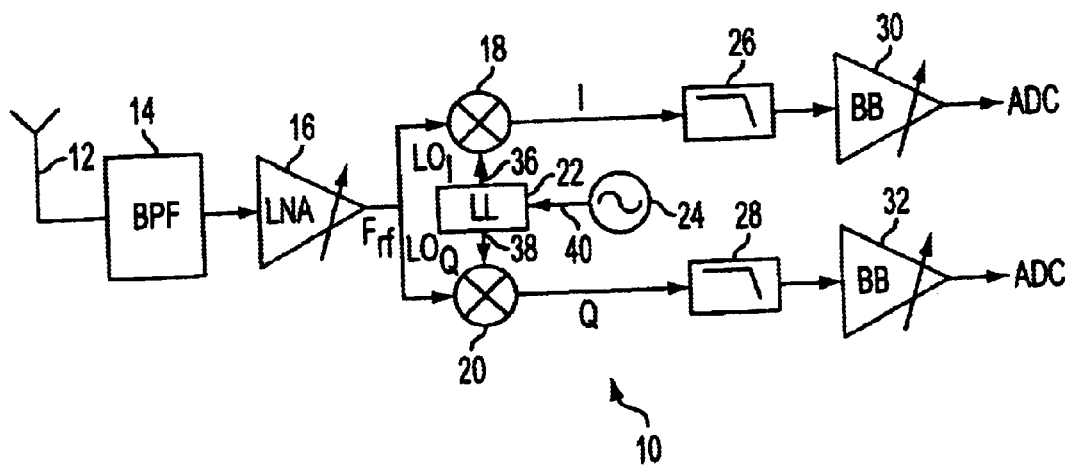
FIG. 1 depicts a portion of a quadrature amplitude modulation receiver system in accordance with an illustrated embodiment of the invention.

FIG. 1 is a block diagram of portion of a direct conversion QAM receiver 10, generally in accordance with an illustrated embodiment of the invention. Within the receiver 10, a QAM information signal $f_{rf}$ is received by an antenna 12 and bandpass filtered in a filter 14. The bandpass filter 14 function to remove any undesired signals from the spectral area surrounding the desired information signal $f_{rf}$.

The filtered signal $f_{rf}$ is provided to a low-noise amplifier (LNF) 16. The LNA 16 functions to amplify the signal $f_{rf}$ to a level convenient for recovery of the constellation of QAM signals.

From the LNA 16, the information signal $f_{rf}$ is applied to a pair of modulators 18, 20, where identical copies of the information signal $f_{rf}$ are modulated with first and second modulation signals $LO_I$ and $LO_Q$ in a process referred to as quadrature subharmonic modulation.

Within the modulators 18, a real portion I of the information signal $f_{rf}$ is reduced to baseband by direct conversion. Within the modulators 20, an imaginary portion Q of the information signal $f_{rf}$ is reduced to baseband by direct conversion. Following conversion to baseband, the I and Q signals may be filtered and amplified in filters 26, 28 and amplifiers 30, 32. After filtering and amplification, the filtered and amplified signals may be applied to analog-to-digital (ADC) converters (not shown) and recovered conventionally.

In order to avoid dc components in the quadrature I and Q outputs, the LO 24 of the illustrated embodiment operates at a fraction (i.e., a subharmonic) of the information signal $f_{rf}$. Direct conversion is achieved within the modulators by modulating a set of switches within each modulator 18, 20 at an effective switching rate sufficient to effectively match a frequency of the modulation signals $LO_I$, $LO_Q$ with the frequency of the information signal $f_{rf}$. Under one illustrated embodiment, the LO 24 operates at one-half the center frequency of the information signal $f_{rf}$.

One difficulty in achieving quadrature subharmonic modulation is the problem of obtaining quadrature between the LO signals which effectively modulate the information signal $f_{rf}$. If the LO 24 operates at one-half the frequency of the information signal $f_{rf}$, then the LO signals must be effectively doubled in frequency to achieve direct conversion. Doubling a set of the LO signals, however, also doubles any phase offset of the LO signals provided to the I and Q modulators 18, 20.

Another difficulty with quadrature subharmonic modulation is the difficulty in providing the proper phase offset of the LO signals supplying the I and Q modulators 18, 20. In the past, passive polyphase filters have been used to supply the LO signals with a 90 degree phase offset to the I and Q modulators. Polyphase filters cannot be used for quadrature subharmonic modulation because a polyphase filter cannot provide a stable phase offset of less than ninety degrees.

In general, it has been found that the phase offset of the LO signals provided to the I and Q modulators 18, 20 of a quadrature subharmonic modulator may be defined by the expression 90/n, where n is the subharmonic multiplier relating the LO frequency to the frequency $f_{rf}$ of the information signal. Further, it has been found that the number of modulating signals provided to each I and Q modulator 18, 20 may be defined by the expression 2n.

Generation of the $LO_I$ and $LO_Q$ signals may be accomplished by a locked-loop (LL) device 22. The LL device 22 may be used to receive a signal from the LO 24 and convert the signal from the LO 24 into a first set of signals (first signal) and a second set of signals (second signal) for application to a respective modulator 18, 20.

Figure 2:
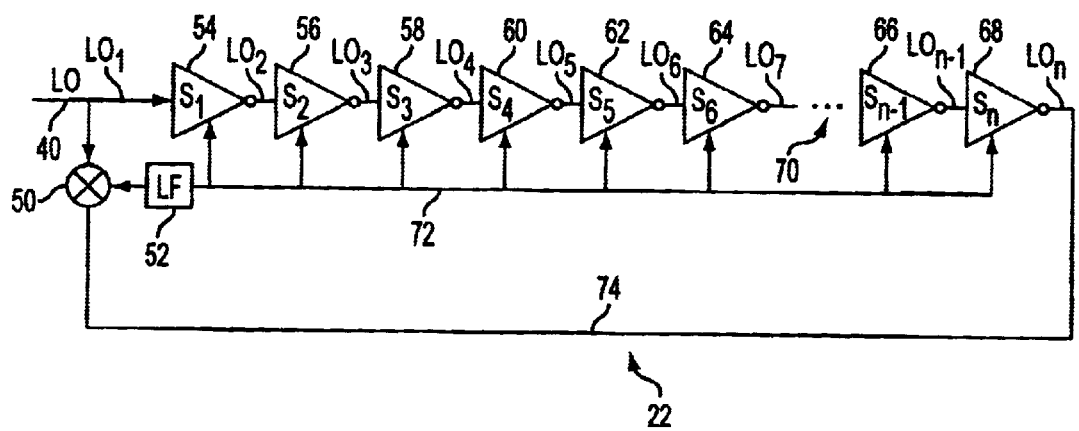
FIG. 2 depicts a locked loop used by the system of FIG. 1.

FIG. 2 is a generalized block diagram of a particular LL 22 (e.g., a delay locked loop (DLL)) that may be used to supply the modulators 18, 20. Under the illustrated embodiment, the LO 24 of FIG. 1 provides a single frequency, single phase input 40 to the LL 22 (shown entering from the left in FIG. 2). Within the LL 22, the input signal from the LO 24 passes through a number of delay stages 54, 56, 58, 60, 62, 64, 66. Within the delay stages, the signal is delayed by a predetermined time period (phase). The overall delay of the delay stages 54, 56, 58, 60, 62, 64, 66 (i.e., from one end to the other) is chosen to have a nominal value of one cycle (i.e., 360°).

Each delay stage 54, 56, 58, 60, 62, 64, 66 is provided with a control input for delay adjustment. The control input of each delay stage of FIG. 2 is shown connected to a common delay control 72.

In operation, the output 74 is compared with the input 40 in a phase detector 50. The output of the phase detector 50 is filtered in a low-pass filter 52 and applied as an input to the common delay control 72. Where the output 74 is delayed by one cycle, the output of the phase detector 50 is zero. Where the output 74 drifts for any reason, the difference detected by the phase detector 50 is used to adjust the control input 72 to bring the overall delay across the LL 22 back to one cycle.

If the LL 22 of FIG. 2 where to contain only eight stages (i.e., the ellipsis 70 were replaced by a solid connection), then the phase delay of each stage would be 45 degrees. Additional stages may be added where smaller delays (e.g., 22½ degrees) are required.

Figure 3:
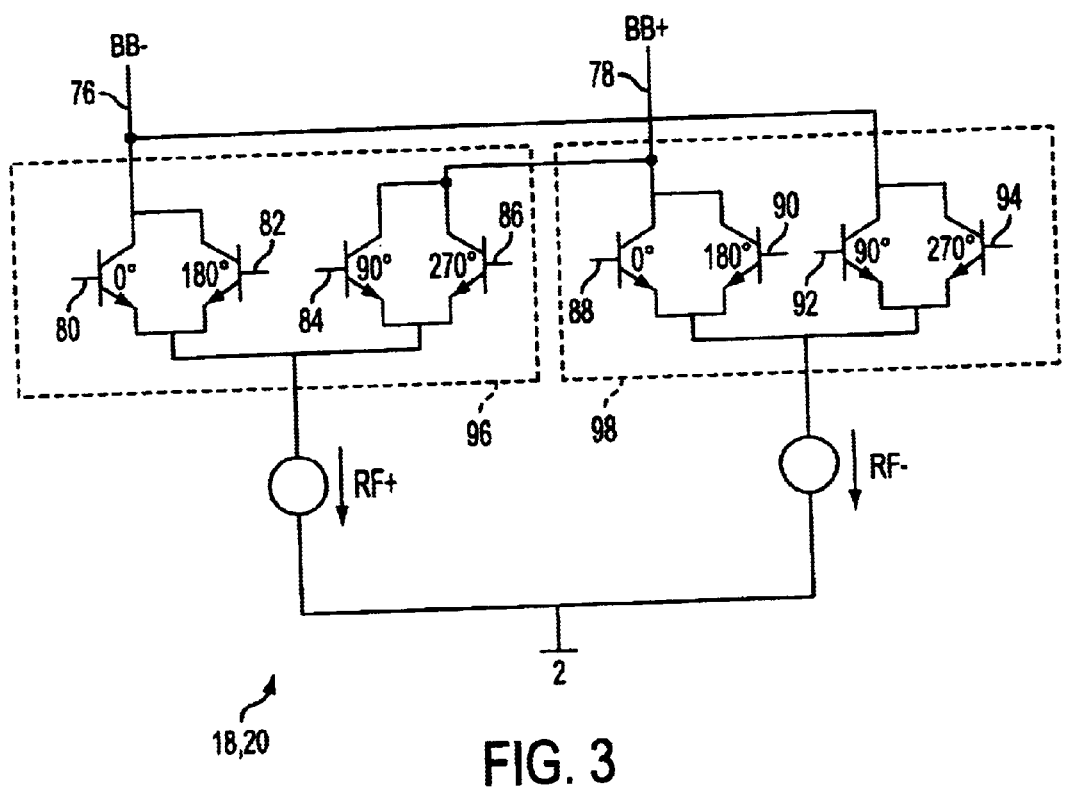
FIG. 3 depicts a modulator used by the system of FIG. 1.

FIG. 3 is a block diagram of a modulator 18, 20 for the specific example of where the subharmonic multiplier n=2. The example of FIG. 3 may be used wherever the information signal $f_{rf}$ resides at twice the frequency of the LO 24.

While the modulator of FIG. 3 may be used to provide either the I and Q outputs to low-pass filters 26, 28, the drive signals differ depending upon the application. For example, if the modulator of FIG. 3 were to provide the I output, then the modulator 18 of FIG. 3 would receive the odd LO outputs of FIG. 2. Similarly, if the modulator of FIG. 3 were to provide the Q output, then the modulator 18 of FIG. 3 would receive the even LO outputs of FIG. 2.

More specifically, if the modulator of FIG. 3 is the I modulator 18 and n=2, then the first set of switching transistors 80, 88 receive their drive signals from odd stage $LO_1$. The phase delay of the first stage is zero degrees.

In contrast, the second switching transistors 82, 90 receive their drive signals from the third odd stage $LO_5$. The phase delay of $LO_5$ is 180 degrees (i.e., 4×45 degrees). The third switching transistors 84, 92 receive their drive signals from the second odd stage $LO_3$ with a phase delay of 90 degrees. The fourth switching transistors receive their drive signals from the fourth odd stage (in this case the stage labeled $LO_7$) with a phase delay of 270 degrees.

It should be noted that the modulator of FIG. 3 has both a RF+ and an RF− leg. Since current would only flow in one leg at a time, the two switching elements 96, 98 serve an analogous function depending upon the polarity of the RF signal.

For example, shown associated with each transistor in FIG. 3 is an instantaneous phase offset for a drive signal for that transistor. As shown at 0°, transistors 80 and 88 are in an activated state resulting in the first output 76 being connected to RF+ and the second output 78 being connected to RF−. At 90°, the connections are reversed. At 90°, transistors 84 and 92 are in an activated state resulting in the first output 76 being connected to RF− and the second output 78 being connected to RF+. At 180°, transistors 82 and 90 are in an activated state resulting in the first output 76 being again connected to RF+ and the second output 78 being connected to RF−. At 270°, transistors 86 and, 94 are in an activated state resulting in the first output 76 being connected to RF− and the second output 78 being connected to RF+.

As shown, for each 360 degrees of phase travel of the signal from the LO oscillator, the switches 96, 98 change polarity twice, thereby simulating 720 degrees of phase travel. Since the phase rate of the switches 96, 98 is twice that of the LO 24, the effective switching rate of the switches 96, 98 is double the frequency $F_{LO}$ of the LO 24.

Where the modulator of FIG. 3 is the Q modulator 20 (and n=2), the first set of switching transistors 80, 88 receive their drive signals from the first even stage $LO_2$. The phase delay of the first stage is 45 degrees.

In contrast, the second switching transistors 82, 90 receive their drive signals from the third even stage $LO_6$. The phase delay of $LO_6$ is 225 degrees (i.e., 5×45 degrees). The third switching transistors 84, 92 receive their drive signals from the second even stage $LO_4$ with a phase delay of 135 degrees. The fourth switching transistors receive their drive signals from the fourth even stage (in this case the stage labeled $LO_n$) with a phase delay of 360 degrees.

The modulators 18, 20 operate by switching and recombining the two branches of a differential current signal in such a way as to generate a differential output current signal dominated by the sum and difference frequencies of the switching frequency and the input frequency $f_{rf}$. Essentially, the modulator puts out a differential current signal roughly equal to the input signal multiplied by a unity amplitude square wave. In a standard prior art Gilbert mixer, the switching frequency is equal to the input LO frequency. Under the illustrated embodiment, the modulator 18, 20 is provided with 2n single ended (or n differential) LO signals phase split in symmetric separations 180/n degrees apart. The effective switching of the modulator 18, 20 then occurs at a frequency equal to $n*F_{LO}$. Where $n*F_{LO}=F_{rf}$, direct conversion to baseband can be accomplished without the difficulties associated with a LO 24 operating at the same frequency as the input signal $F_{rf}$.

The example of FIGS. 2 and 3 is based upon n=2. It should be noted, that n could just have easily been made equal to 4. Using n=4, the phase delay would equal 22½ degrees. A LL 22 constructed with n=4 would require 8 inputs to each the switching elements 96, 98 of the modulators 18, 20 (and eight transistors in each switching element 96, 98) resulting in a switching rate four times that of LO 24.

Further, using n=4 would allow the direct conversion of two $F_{rf}$ signals, where $F_{rf1}=2F_{rf2}$. Direct conversion of the first signal $F_{rf1}$ may be accomplished with 8 inputs to each of the switching elements 96, 98. Direct conversion of the second signal $F_{rf2}$ may be accomplished with 4 inputs to each of the switching elements shown in FIG. 3 using every other odd and every other even output of the LL 22, as described above.

Figure 4:
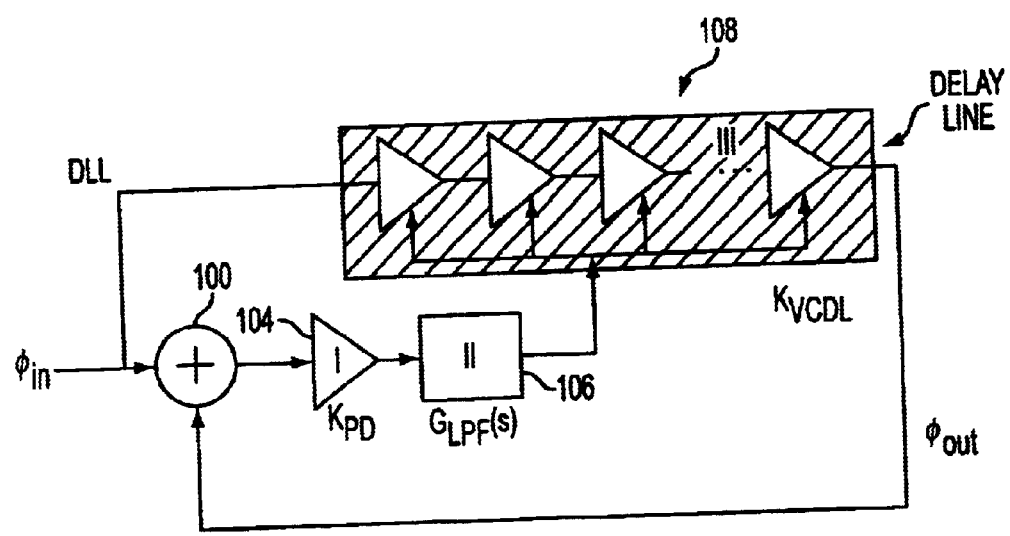
FIG. 4 depicts a mathematical model of the locked loop of FIG. 2.
Figure 5:
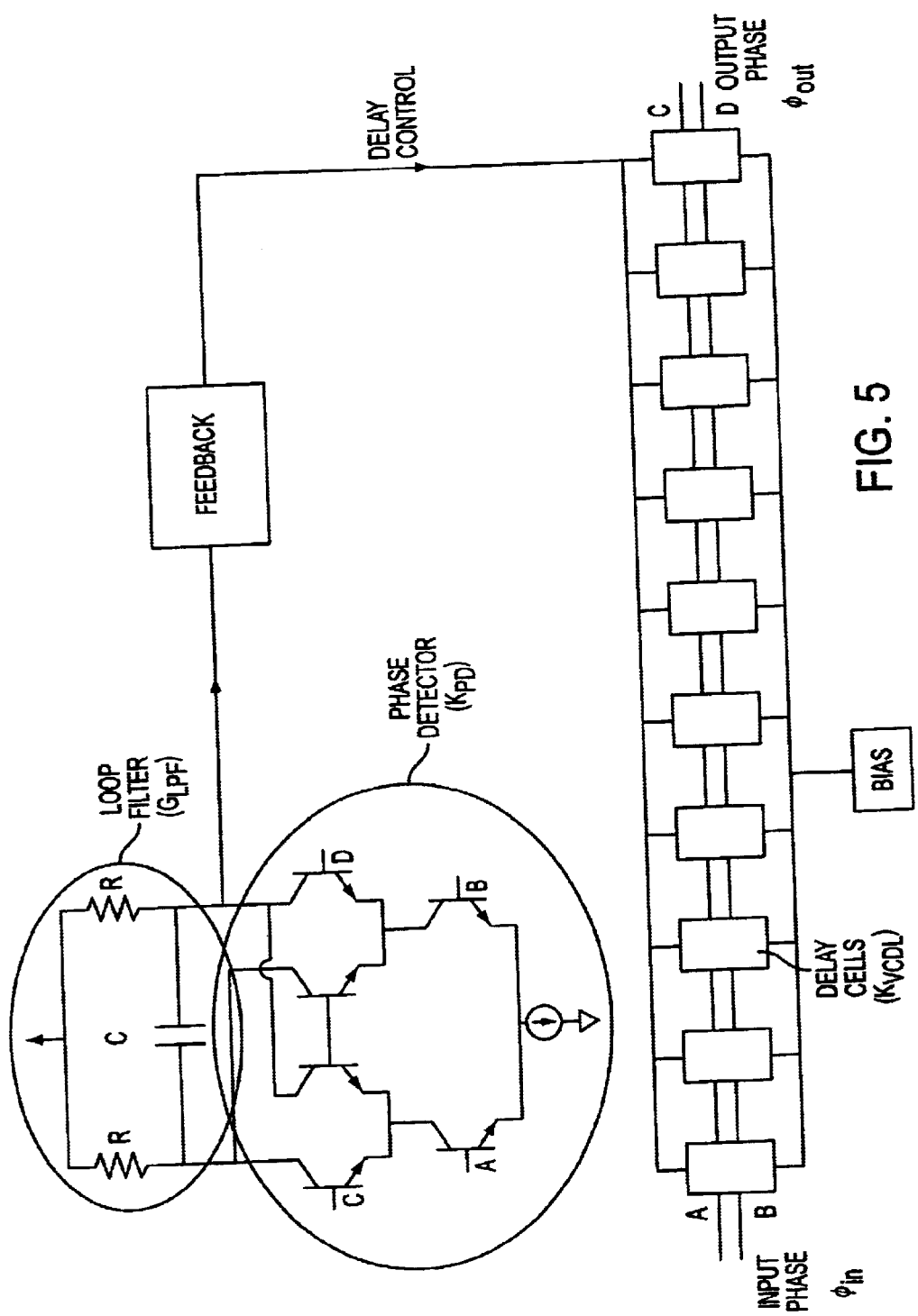
FIG. 5 depicts an exemplary schematic circuit diagram of the model of FIG. 4.
Figure 6:
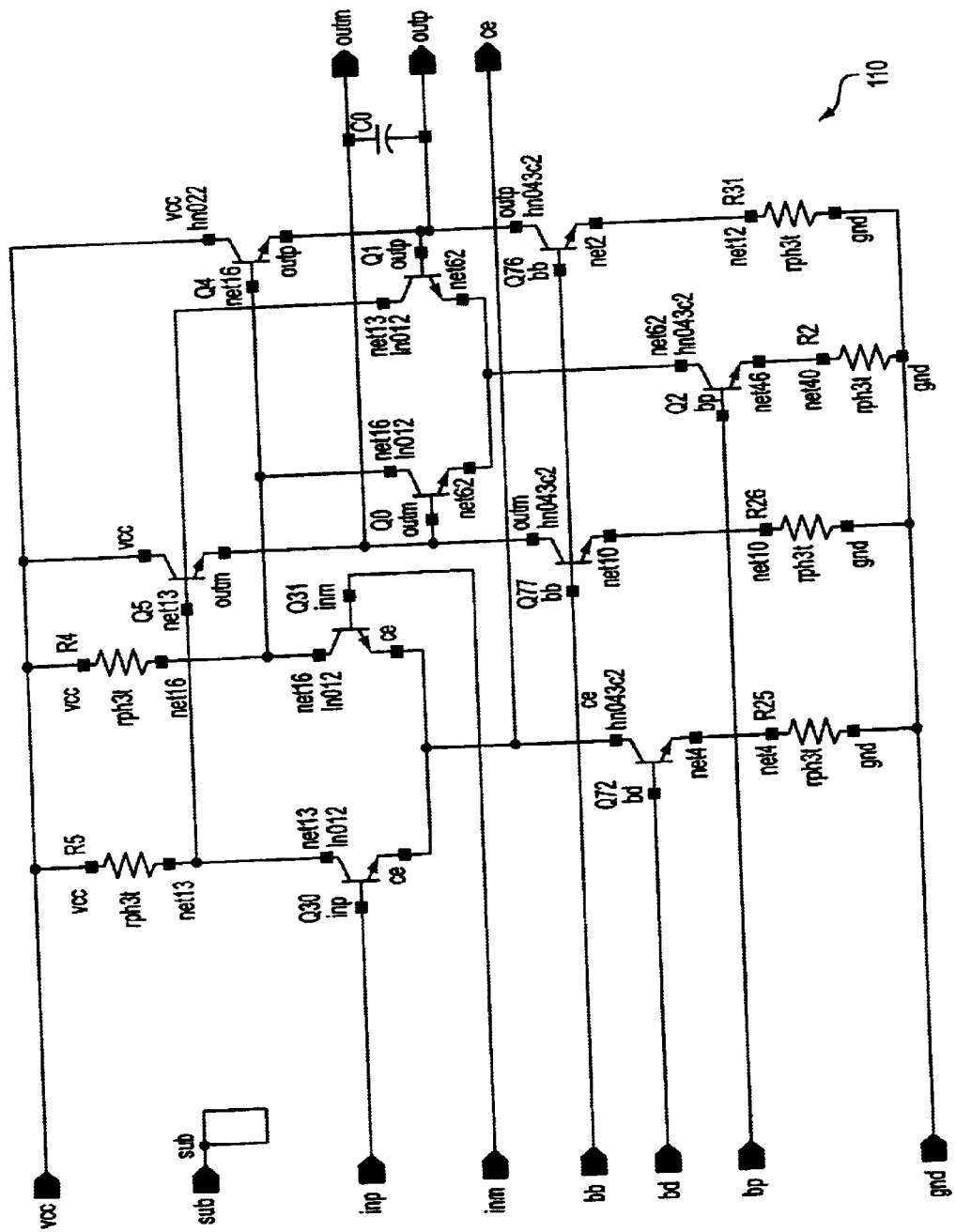
FIG. 6 depicts a delay cell of the schematic circuit of FIG. 5.

FIG. 4 is a generalized block diagram of the LL 22 using a DLL model. FIG. 5 is a schematic of a circuit that may be used to accomplish the functionality of the block diagram of FIG. 4. FIG. 6 is a schematic of a particular delay cell 110 of the schematic of FIG. 5.

A closed-loop transfer function H(s) can be written for the DLL of FIG. 4 relating the output $\phi_{OUT}$ to the input $\phi_{IN}$. The transfer function may have the form as follows:

$$H(s) = \frac{K_{PD}*G_{LPF}(s)*K_{VCDL}}{1+K_{PD}*G_{LPF}(s)*K_{VCDL}},$$

where $K_{PD}$ represents the transfer function of the phase detector 100, 104, $G_{LPF}(S)$ is the transfer function of the filter 106 and $K_{VCDL}$ is the transfer function of the delay line 108. With the appropriate selection of components, the LL 22 (of FIG. 1) and transfer function may be used to advantage in providing a considerable reduction in the complexity in the construction of encoders and decoders of quadrature amplitude communication systems.

Figure 7:
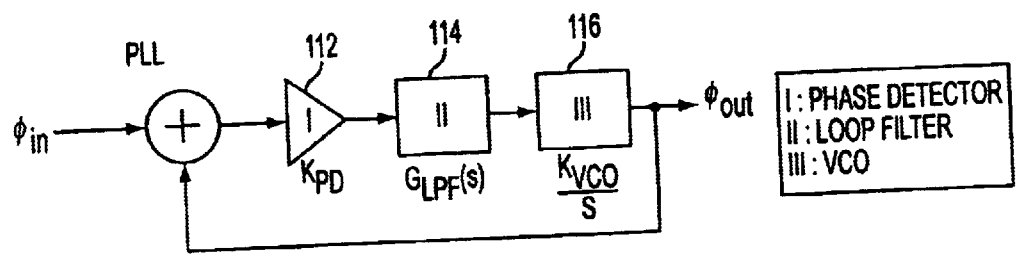
FIG. 7 depicts a mathematical model of a phase locked loop that may be used with the system of FIG. 1.

In another embodiment of the invention, the phase locked loop (PLL) of FIG. 7 may be used as the LL 22 of FIG. 1. As is well known in the art, a voltage controlled oscillator 116 may be constructed with a number of phase delay stages. Where an output of the VCO 116 is compared with an output of the LO 24 and filtered in a filter 114, the result is a lock loop device that is sufficiently stable for most applications of the LL 22 of FIG. 1.

As with the DLL (above), a transfer function H(s) may be provided for the PLL of FIG. 7. The transfer function may have the form as follows:

$$H(s) = \frac{K_{PD}*G_{LPF}(s)*K_{VCO}}{s+K_{PD}*G_{LPF}(s)*K_{VCO}},$$

where $K_{PD}$ represents the transfer function of the phase detector 112, $G_{LPF}(S)$ is the transfer function of the filter 114 and $K_{VCO}/s$ is the transfer function of the VCO 116.

It has been generally recognized that the out-of-band noise in DLLs is inherently lower than that of a PLL due to the fact that a delay chain is always less noisy than a corresponding ring oscillator since noise is not circulated within it. However, in some cases, either a ring oscillator or the corresponding delay chain may be used to provide accurate phase split versions of the input reference signal when the outputs of the individual stages are tapped off at appropriate intervals.

In next generation transceivers that make use of a subharmonic mixer based direct downconversion receiver architecture, the multiple phase separated LO required by the preprocessor may be obtained from the on-chip VCO by means of such an architecture with a DLL chain running at the appropriate frequency. Where good matching between the stages in the DLL is maintained, the problem of multiple phase LO generation can be reduced to one of symmetrically tapping off the signals (at equal intervals) from a DLL chain locked to a master VCO of the receiver.

A DLL provides superior performance in terms of phase noise when compared to the use of a ring oscillator locked in a PLL although the use of a ring oscillator is very similar. Further, it is contemplated that the PLL may find use as the LL 22 in many applications.

Where dual-band operation is required, the functionality of the LL 22 may be provided using a number of variations. For example, when it is not necessary to decode both bands at once, the LL 22 may be operated at two different frequencies corresponding to the LO signals required for dual-band operation. In both cases, 45 degree phase split LO signals are tapped off of the delay stages at the appropriate location of the DLL chain at either of the two operating frequencies.

Alternatively, the DLL may be operated at only one frequency and the LO signals are tapped off in phase separations of 22.5 degrees for the one frequency and alternate 45 degree phase separations for the other frequency. This makes it possible to use only one DLL, but then requires that the higher frequency band employ a subharmonic mixer using a quarter LO.

Further, for non-coincidental dual-band operation, a low-noise ring oscillator may be used, instead of the DLL. As above, the phase differences at either frequency may be tapped off at the appropriate point in the ring.

Alternatively, the ring oscillator may be provided with phase separations of 22.5 degrees. Dual-band operation may be accomplished by tapping off of every tap or every other tap.

The advantage of the system described above lies in the ease by which accurate phase split signals can be obtained using an LL 22, as opposed to a polyphase network of some type. Although, in the case of 90 degree phase splits it would be easier to use a polyphase network, there is no polyphase network that can accurately provide 45 degree or 22.5 degree phase splits, which are required in the case of higher order subharmonic mixers.

Prior art passive schemes for phase split LO generation have traditionally suffered from two problems. One problem is that in the case of 90 degree phase splitting, it is necessary for phase split signals to simultaneously achieve matched amplitude and substantially perfect quadrature. Only one can be achieved at a time. As a consequence, amplitude matching is often sacrificed resulting in the generation of even harmonics at the mixer port. This problem is avoided using the system described herein.

The second problem lies in the generation of split phase signals of less than 90 degrees. However, even if signals of less than 90 degrees could be generated, there is still no method of simultaneously maintaining the necessary phase and amplitude relationship.

The LL and mixer of FIG. 1, avoids both of these problems, which are critical in receiver LO operation. In addition, since the LL and modulators of FIG. 1 are inherently stable, the trend to smaller split phases represents less of a problem to future improvements than do systems based upon polyphase networks.

A specific embodiment of a method and apparatus for multiple phase splitting for dual band subharmonic mixer drive chains according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of generating first and second modulation signals from a local oscillator signal for quadrature subharmonic modulation of a quadrature amplitude modulated information signal, such method comprising the steps of:
    delaying the local oscillator signal in a plurality of incremental odd and even delay steps to form respective sets of odd and even modulator signals, said odd set of modulator signals together forming the first modulation signal and said even set forming the second modulation signal for quadrature subharmonic modulation of the quadrature amplitude modulated information signal; and
    controlling a magnitude of the incremental delays based upon a predetermined phase offset between the local oscillator signal and a last delay step of the incremental delay steps.

2. The method of generating first and second local oscillator signals as in claim 1 further comprising defining the first modulation signal as a real part of the quadrature subharmonic modulation signal.

3. The method of generating first and second local oscillator signals as in claim 1 further comprising defining the second modulation signal as an imaginary part of the quadrature subharmonic modulation signal.

4. The method of generating first and second local oscillator signals as in claim 1 further comprising defining the delay of each delay step as substantially equal to ninety degrees divided by a modulator multiplier value.

5. The method of generating first and second local oscillator signals as in claim 4 further comprising defining the first and second modulation signals as having a number of respective odd and even members equal to two times the modulator multiplier value.

6. The method of generating first and second local oscillator signals as in claim 1 further comprising defining a first incremental odd delay step as equal to zero degrees.

7. The method of generating first and second local oscillator signals as in claim 6 further comprising defining a first even delay step as equal to forth-five degrees.

8. The method of generating first and second local oscillator signals as in claim 7 further comprising defining a second incremental odd delay step as equal to ninety degrees.

9. The method of generating first and second local oscillator signals as in claim 8 further comprising defining a second even delay step as equal to one-hundred and thirty-five degrees.

10. Apparatus for generating first and second modulation signals from a local oscillator signal for quadrature subharmonic modulation of a quadrature amplitude modulated information signal, such apparatus comprising:
    means for delaying the local oscillator signal in a plurality of incremental odd and even delay steps to form respective sets of odd and even modulator signals, said odd set of modulator signals together forming the first modulation signal and said even set forming the second modulation signal for quadrature subharmonic modulation of the quadrature amplitude modulated information signal; and
    means for controlling a magnitude of the incremental delays based upon a predetermined phase offset between the local oscillator signal and a last delay step of the incremental delay steps.

11. The apparatus for generating first and second local oscillator signals as in claim 10 further comprising means for defining the first modulation signal as a real part of the quadrature subharmonic modulation signal.

12. The apparatus for generating first and second local oscillator signals as in claim 10 further comprising means for defining the second modulation signal as an imaginary part of the quadrature subharmonic modulation signal.

13. The apparatus for generating first and second local oscillator signals as in claim 10 further comprising means for defining the delay of each delay step as substantially equal to ninety degrees divided by a modulator multiplier value.

14. The apparatus for generating first and second local oscillator signals as in claim 13 further comprising means for defining the first and second modulation signals as having a number of respective odd and even members equal to two times the modulator multiplier value.

15. The apparatus for generating first and second local oscillator signals as in claim 10 further comprising means for defining a first incremental odd delay step as equal to zero degrees.

16. The apparatus for generating first and second local oscillator signals as in claim 15 further comprising means for defining a first even delay step as equal to forth-five degrees.

17. The apparatus for generating first and second local oscillator signals as in claim 16 further comprising means for defining a second incremental odd delay step as equal to ninety degrees.

18. The apparatus for generating first and second local oscillator signals as in claim 17 further comprising means for defining a second even delay step as equal to one-hundred and thirty-five degrees.

19. Apparatus for generating first and second modulation signals from a local oscillator signal for quadrature subharmonic modulation of a quadrature amplitude modulated information signal, such apparatus comprising:
    a delay chain adapted to delay the local oscillator signal in a plurality of incremental odd and even delay steps to form respective sets of odd and even modulator signals, said odd set of modulator signals together forming the first modulation signal and said even set forming the second modulation signal for quadrature subharmonic modulation of the quadrature amplitude modulated information signal; and a feedback circuit adapted to control a magnitude of the incremental delays based upon a predetermined phase offset between the local oscillator signal and a last delay step of the incremental delay steps.

20. The apparatus for generating first and second local oscillator signals as in claim 19 wherein the first modulation signal further comprises a real part of the quadrature subharmonic modulation signal.

21. The apparatus for generating first and second local oscillator signals as in claim 19 wherein the second modulation signal further comprises an imaginary part of the quadrature subharmonic modulation signal.

22. The apparatus for generating first and second local oscillator signals as in claim 19 wherein the delay chain further comprises a plurality of series connected delay elements where each delay step is substantially equal to ninety degrees divided by a modulator multiplier value.

23. The apparatus for generating first and second local oscillator signals as in claim 22 wherein the first and second signals further comprise respective sets of odd and even members equal to two times the modulator multiplier value.

24. The apparatus for generating first and second local oscillator signals as in claim 19 a first incremental odd delay step of the delay chain further comprises zero degrees.

25. The apparatus for generating first and second local oscillator signals as in claim 24 wherein the first even delay step further comprises forth-five degrees.

26. The apparatus for generating first and second local oscillator signals as in claim 25 wherein the second incremental delay step further comprises a total delay of ninety degrees.

27. The apparatus for generating first and second local oscillator signals as in claim 26 wherein the second even delay step further comprises a total delay of one-hundred and thirty-five degrees.

* * * * *